United States Patent
Chen et al.

(10) Patent No.: US 11,721,759 B2
(45) Date of Patent: Aug. 8, 2023

(54) METHOD FOR FORMING GATE METAL STRUCTURE HAVING PORTIONS WITH DIFFERENT HEIGHTS

(71) Applicant: NANYA TECHNOLOGY CORPORATION, New Taipei (TW)

(72) Inventors: Yu-Ping Chen, New Taipei (TW); Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/811,588

(22) Filed: Jul. 11, 2022

(65) Prior Publication Data
US 2022/0344507 A1 Oct. 27, 2022

Related U.S. Application Data

(62) Division of application No. 17/168,148, filed on Feb. 4, 2021, now Pat. No. 11,424,360.

(51) Int. Cl.
*H01L 29/78* (2006.01)
*H01L 29/66* (2006.01)
*H01L 29/417* (2006.01)
*H01L 29/423* (2006.01)

(52) U.S. Cl.
CPC .... *H01L 29/7827* (2013.01); *H01L 29/41741* (2013.01); *H01L 29/4236* (2013.01); *H01L 29/66666* (2013.01)

(58) Field of Classification Search
CPC ........... H01L 29/7827; H01L 29/41741; H01L 29/4236; H01L 29/66666
USPC ...................................................... 257/330
See application file for complete search history.

(56) References Cited

U.S. PATENT DOCUMENTS

| | | | |
|---|---|---|---|
| 7,323,746 B2 | 1/2008 | Park et al. | |
| 7,368,769 B2 | 5/2008 | Paik | |
| 7,723,768 B2 | 5/2010 | Suh | |
| 7,932,554 B2 | 4/2011 | Kim | |
| 8,012,828 B2 | 9/2011 | Min et al. | |
| 8,546,858 B2 * | 10/2013 | Jang | H10B 12/053 257/288 |
| 8,835,259 B2 | 9/2014 | Jang | |
| 8,859,367 B2 | 10/2014 | Mathew et al. | |
| 8,901,630 B2 | 12/2014 | Huh et al. | |
| 9,178,039 B2 * | 11/2015 | Park | H01L 29/66621 |
| 9,240,477 B2 | 1/2016 | Pandey et al. | |
| 9,349,858 B2 | 5/2016 | Hwang et al. | |

(Continued)

FOREIGN PATENT DOCUMENTS

CN 111900201 A 11/2020

*Primary Examiner* — Mohammad M Hoque
(74) *Attorney, Agent, or Firm* — CKC & Partners Co., LLC

(57) ABSTRACT

A semiconductor device includes a substrate, a dielectric layer, a source region, a drain region, and a metal structure. The substrate has a trench therein, and the dielectric layer is conformally formed over the substrate and the trench. The source region and the least one drain region are in the substrate. The metal structure is filled in the trench and surrounded by the dielectric layer, and the metal structure is disposed between the source region and the drain region. Moreover, the metal structure has a first metal portion and a second metal portion which has a height greater than a height of the first metal portion, and the first metal portion is disposed between the drain region and the second metal portion.

10 Claims, 13 Drawing Sheets

(56) References Cited

U.S. PATENT DOCUMENTS

| | | |
|---|---|---|
| 9,368,589 B2 | 6/2016 | Baek et al. |
| 9,634,011 B2 | 4/2017 | Kang et al. |
| 9,704,988 B2 | 7/2017 | Oh |
| 9,728,617 B2 | 8/2017 | Poelzl |
| 9,972,628 B1 | 5/2018 | Goswami et al. |
| 10,074,656 B1 | 9/2018 | Wang et al. |
| 10,217,750 B1 | 2/2019 | Lin et al. |
| 10,312,243 B2 | 6/2019 | Lee et al. |
| 10,424,649 B2 | 9/2019 | Moon et al. |
| 10,790,287 B2 * | 9/2020 | Kang ................. H01L 21/28088 |
| 10,811,408 B2 | 10/2020 | Seo et al. |
| 11,183,579 B2 | 11/2021 | Kim |
| 11,189,618 B2 | 11/2021 | Jeon et al. |
| 2004/0135176 A1 | 7/2004 | Kim |
| 2005/0087776 A1 | 4/2005 | Kim |
| 2007/0262395 A1 | 11/2007 | Gibbons et al. |
| 2007/0264771 A1 | 11/2007 | Ananthan et al. |
| 2011/0003459 A1 * | 1/2011 | Shin .................... H01L 29/4236 |
| | | 257/E21.546 |
| 2012/0126885 A1 | 5/2012 | Juengling et al. |
| 2017/0069632 A1 | 3/2017 | Wu |
| 2020/0161305 A1 | 5/2020 | Nam |

\* cited by examiner

METHOD FOR FORMING GATE METAL STRUCTURE HAVING PORTIONS WITH DIFFERENT HEIGHTS

CROSS-REFERENCE TO RELATED APPLICATION

This application is a Divisional Application of the U.S. application Ser. No. 17/168,148, filed on Feb. 4, 2021, the entirety of which is incorporated by reference herein in their entireties.

BACKGROUND

Field of Invention

The present invention relates to a recessed access device and a method for manufacturing the same.

Description of Related Art

Transistor devices are used with semiconductor devices for numerous purposes, and such use is well known. The characteristics of transistor devices are also well known and documented so that further research may improve the transistor devices. For example, in the case of NMOS transistor devices, it is well known that the drive current of an NMOS transistor device will be higher when a high work function gate material is used as opposed to a low work function gate material. The drive current is stronger in a high work function material because the substrate doping can be much lower with a high work function material, resulting in mobility improvement and an improved drive current.

Similar to NMOS transistor devices, access transistor devices used with memory devices, such as DRAM memory, exhibit a higher drive current when a high work function material is used to form the access transistor as compared to when a low work function material is used. However, the use of a high work function material to form an access transistor in a memory device may lead to off-state leakage across the access transistor. Off-state leakage includes current leakage that occurs when the access transistor is in an "off" state. Typically, off-state leakage includes two types of leakage: sub-threshold leakage between a source and a drain region associated with the access transistor and leakage between the drain and the substrate of an access device. The leakage from the drain to the substrate may include both junction leakage and gate-induced drain leakage. Junction leakage may include Schokley-Read-Hall type junction leakage and is undesirable. Gate-induced drain leakage (GIDL) is also undesirable.

Recessed access devices (RADs) used as access transistors in memory devices are especially susceptible to gate-induced drain leakage when in an "off" state. The gate-induced drain leakage of a RAD structure dominates the off-state leakage that occurs with such devices. Thus the refresh rate of a RAD structure, and a memory device employing RAD structures, may be dependent upon the amount of gate-induced drain leakage in the RAD device.

Therefore, it is desirable to reduce the amount of gate-induced drain leakage in a RAD structure. It is also desirable to reduce the amount of gate-induced drain leakage while controlling or reducing the amount of other leakages present in the RAD structure or access transistor.

SUMMARY

Embodiments of the invention relate to recessed access devices. More particularly, embodiments of the invention also relate to methods of forming recessed access devices for reducing gate-induced drain leakage (GIDL) current losses from a recessed access device. These and other features, aspects, and advantages of the present invention will become better understood with reference to the following description and appended claims.

An aspect of the present disclosure is related to a semiconductor device which includes a substrate, a dielectric layer, a source region, a drain region, and a metal structure. The substrate has a trench therein, and the dielectric layer is conformally formed over the substrate and the trench. The source region and the least one drain region are in the substrate. A metal structure is filled in the trench and surrounded by the dielectric layer, and the metal structure is disposed between the source region and the drain region. Moreover, the metal structure has a first metal portion and a second metal portion which has a height greater than a height of the first metal portion, and the first metal portion is disposed between the drain region and the second metal portion.

In some embodiments of the present disclosure, the semiconductor device includes a first poly-metal structure and a second poly-metal structure. The first poly-metal structure is partially in the source region, and the second poly-metal structure is on the drain region.

In some embodiments of the present disclosure, the first poly-metal structure has a vertical length greater than a vertical length of the second poly-metal structure.

In some embodiments of the present disclosure, the semiconductor device further includes an isolation layer disposed over the dielectric layer and the metal structure, in which the first and second poly-metal structures extend through the isolation layer.

In some embodiments of the present disclosure, the semiconductor device further includes a dielectric cap between the isolation layer and the metal structure, in which the dielectric cap has a dielectric constant lower than a dielectric constant of the isolation layer.

In some embodiments of the present disclosure, the source region has a p-n junction lower than a p-n junction of each drain region.

Another aspect of the present disclosure is related to a semiconductor device which includes a substrate, a dielectric layer, a source region, two drain regions, and two metal structures. The substrate has two trenches therein, and the dielectric layer is conformally formed over the substrate and the two trenches. The source region and the two drain regions are located in the substrate. The two metal structures are respectively filled in the two trenches and surrounded by the dielectric layer, the source region is between the two metal structures, and the two metal structures are between the two drain regions. Each metal structure has a first metal portion and a second metal portion which has a height greater than a height of the first metal portion, in which the second metal portions are between the first metal portions.

In some embodiments of the present disclosure, the semiconductor device further includes a first poly-metal structure and two second poly-metal structures. The first poly-metal structure is partially in the source region, and the two second poly-metal structures are respectively on the two drain regions.

In some embodiments of the present disclosure, the first poly-metal structure has a vertical length greater than a vertical length of each second poly-metal structure.

In some embodiments of the present disclosure, the semiconductor device further includes an isolation layer disposed over the dielectric layer and the metal structures, in which the first and second poly-metal structures extend through the isolation layer.

In some embodiments of the present disclosure, the semiconductor device further includes two dielectric caps, and each dielectric cap is located between the isolation layer and each metal structure, in which each dielectric cap has a dielectric constant lower than a dielectric constant of the isolation layer.

In some embodiments of the present disclosure, the source region has a p-n junction lower than a p-n junction of each drain region.

Another aspect of the present disclosure is related to a method for manufacturing a semiconductor device. The method includes forming a first source region and a drain region in an active region of a substrate, in which a trench is between the first source region and the drain region; conformally forming a dielectric layer over the substrate and the trench; forming a metal structure in the trench, in which the dielectric layer surrounds the metal structure; performing a first etching process to an edge of the metal structure, such that the metal structure has a first metal portion and a second metal portion which has a height greater than a height of the first metal portion, in which the first metal portion is between the drain region and the second metal portion; and forming a first poly-metal structure electrically connected to the first source region and a second poly-metal structure electrically connected to the drain region.

In some embodiments of the present disclosure, forming the first source region and the drain region includes forming a p-type well in the substrate and a first n-type well in the p-type well; and forming the trench in the p-type well and the first n-type well, such that the first source region and the drain region are formed.

In some embodiments of the present disclosure, forming the first poly-metal structure includes forming an isolation layer over the dielectric layer and the metal structure after the first etching process; forming a first opening extending through the isolation layer to expose the first source region; and forming the first poly-metal structure in the first opening.

In some embodiments of the present disclosure, the method further includes doping the first source region with an n-type dopant to form a second source region before the first poly-metal structure is formed, such that the second source region has a p-n junction lower than a p-n junction of the drain region.

In some embodiments of the present disclosure, the method further includes forming a dielectric cap on the metal structure before the isolation layer is formed, in which the dielectric cap has a dielectric constant lower than a dielectric constant of the isolation layer.

In some embodiments of the present disclosure, forming the second poly-metal structure includes forming an isolation layer over the dielectric layer and the metal structure after the first etching process is performed; forming a second opening extending through the isolation layer to expose the drain region; and forming the second poly-metal structure in the second opening.

In embodiments of the present disclosure, a metal structure is between a source region and a drain region, in which each metal structure has a first metal portion and a second metal portion which have different heights. As a result, the metal structure configured to be a gate metal structure can control the current flow between the source region and the drain region, so as to curb the gate-induced drain leakage thereof.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
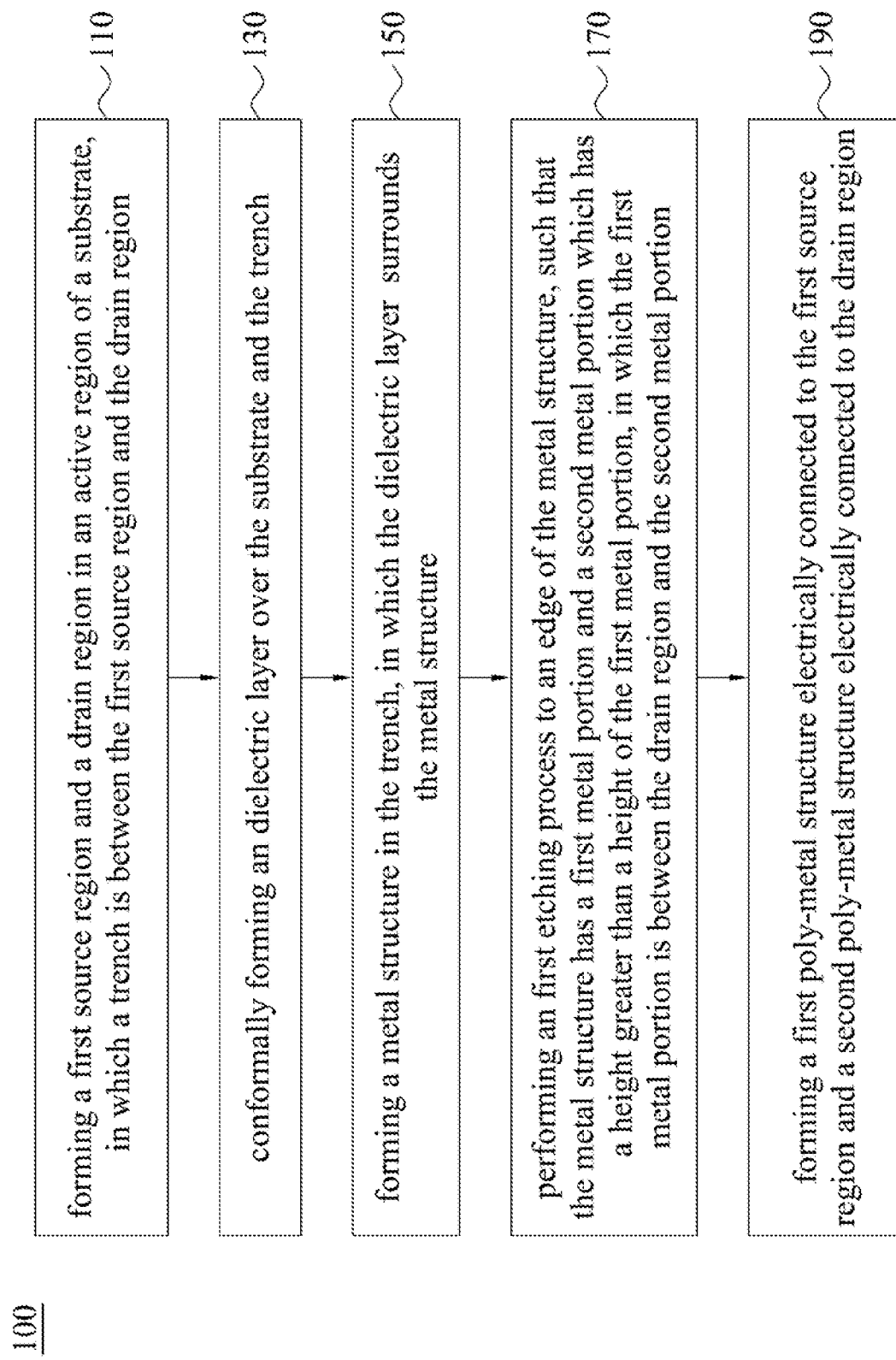
FIG. 1 is a flowchart of a method for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 for fabricating a semiconductor device in accordance with some embodiments of the present disclosure. The method 100 begins with Step 110, in which a first source region and a drain region are formed in an active region of a substrate, and a trench is between the first source region and the drain region. Thereafter, the method 100 continues with Step 130, in which a dielectric layer is conformally formed over the substrate and the trench. The method 100 continues with Step 150, in which a metal structure is formed in the trench, and the dielectric layer surrounds the metal structure. Thereafter, the method 100 continues with Step 170, in which a first etching process is performed to an edge of the metal structure, such that the metal structure has a first metal portion and a second metal portion. The second metal portion has a height greater than a height of the first metal portion, and the first metal portion is between the drain region and the second metal portion. The method 100 continues with Step 190, in which a first poly-metal structure and a second poly-metal structure are formed. The first poly-metal structure is electrically connected to the source region, and the second poly-metal structure is electrically connected to the drain region.

Figure 2:
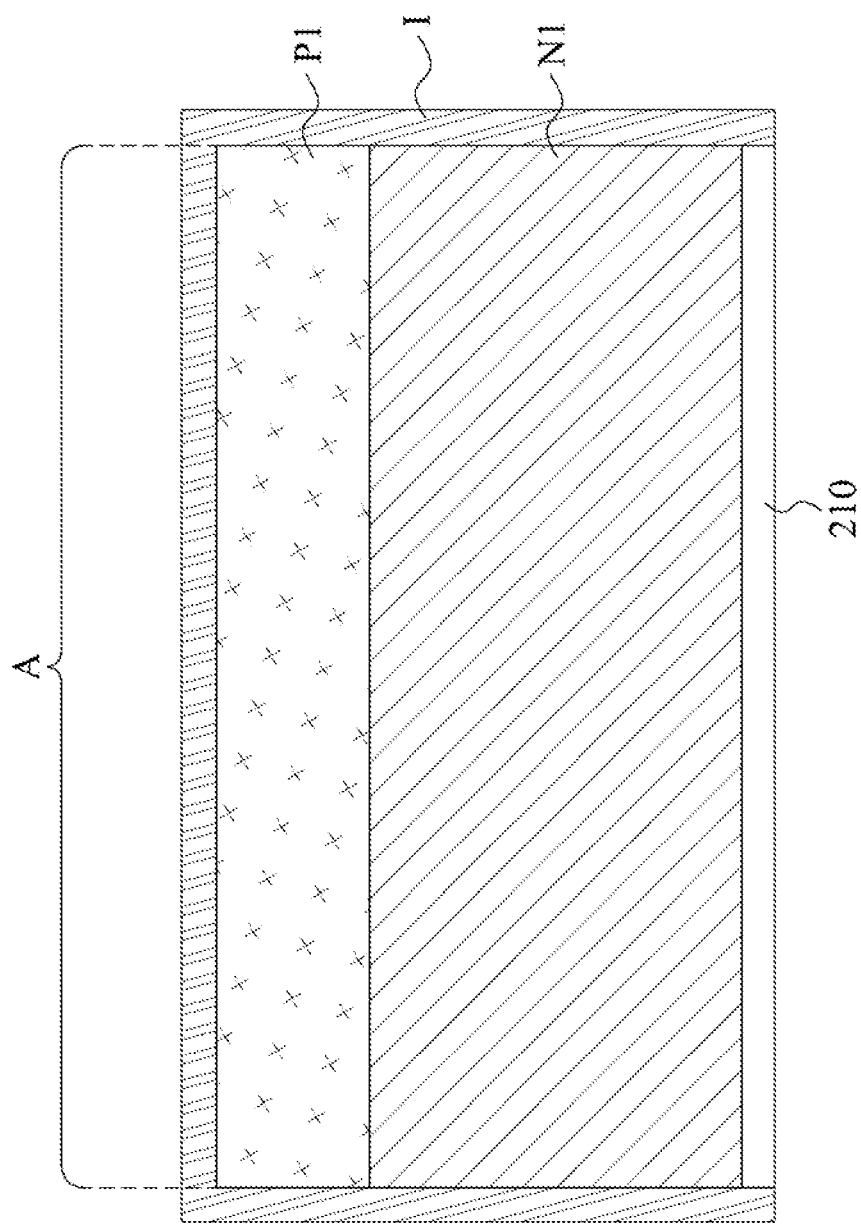
FIGS. 2-13 are cross-sectional views of intermediate stages of a method for fabricating a semiconductor device in accordance with some embodiments of the present disclosure.
Figure 3:
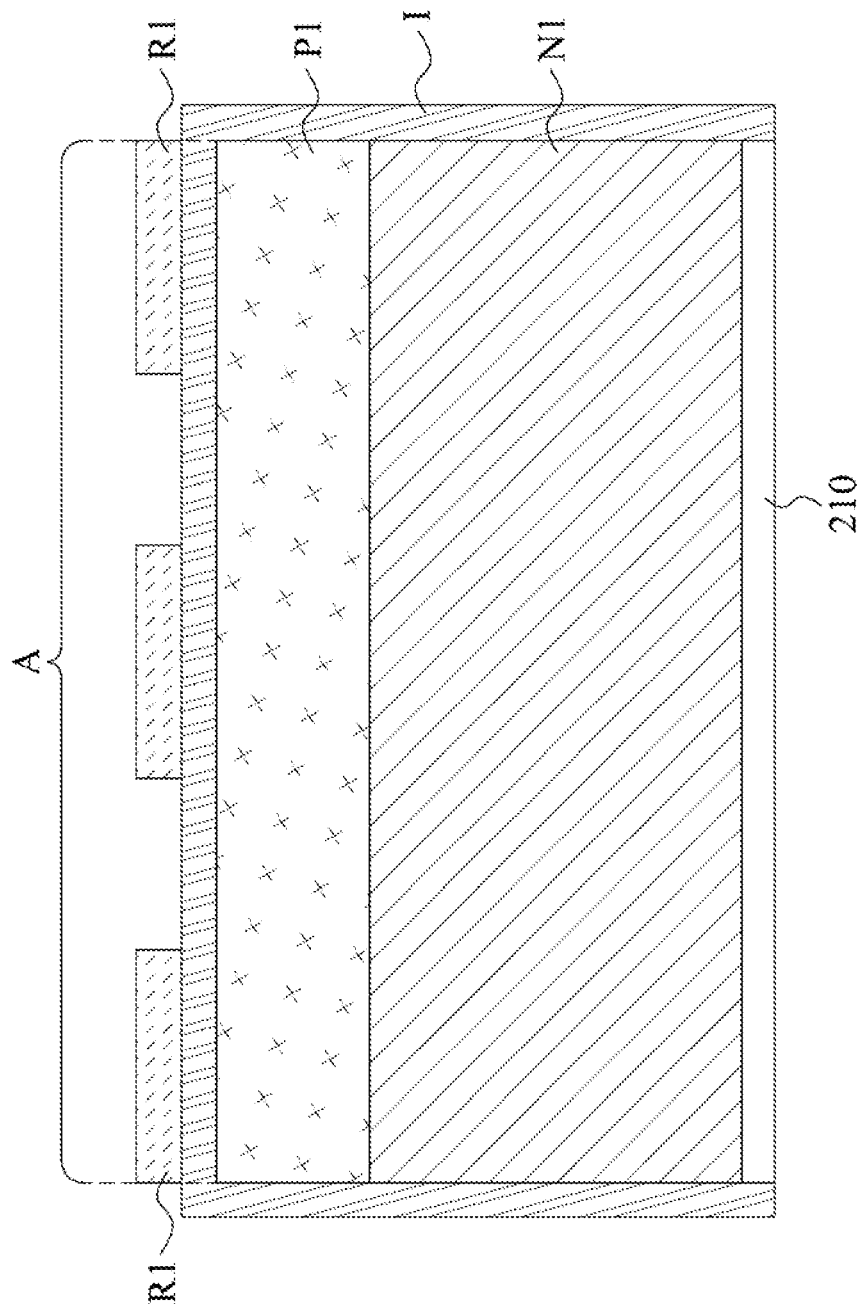
Figure 4:
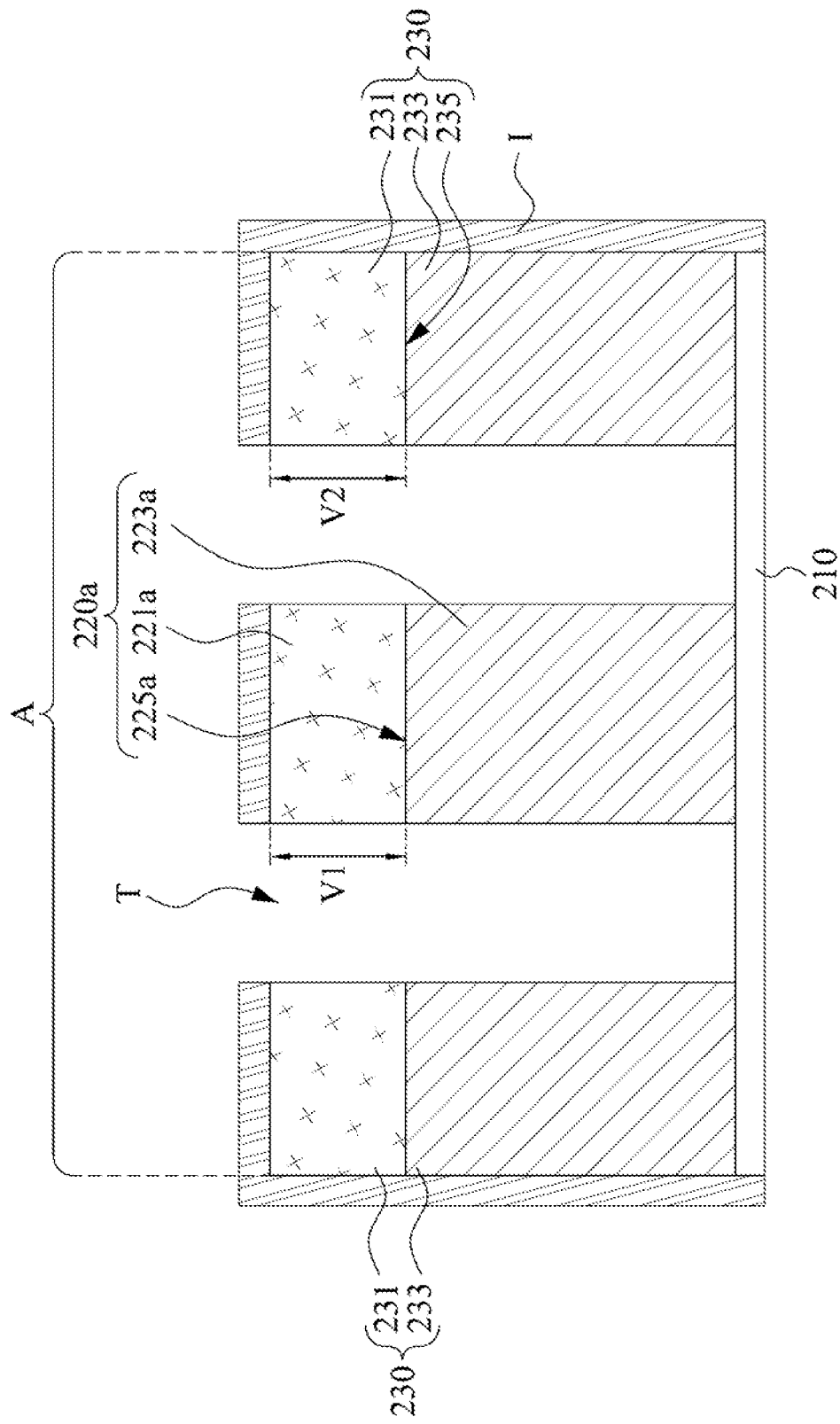

Reference is made to FIGS. 2-4. FIG. 2 to FIG. 4 can represent Step 110, in which a source region 220a and two drain regions 230 are formed in an active region A of a substrate 210, and one of two trenches T is between the source region 220a and one of the drain regions 230. In FIG. 2, an isolation structure I such as a shallow trench isolation (hereinafter abbreviated as STI) structure is formed partially in the substrate 210 for defining the active region A. Thereafter, a p-type well P1 is formed in the substrate 210, and a first n-type well N1 is formed in the p-type well P1. The p-type well P1 and the first n-type well N1 are within the active region A. The substrate 210 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof, and the isolating structure I can include silicon oxide ($SiO_2$). The p-type well P1 is doped with P-type dopants such as boron, and the first n-well N1 is doped with N-type dopants such as arsenic or phosphorous. The present disclosure is not limited in this respect.

Reference is made to FIG. 3. In FIG. 3, a patterned photoresist layer R1 is formed over the substrate 210, the p-type well P1, and the first n-type well N1. The patterned photoresist layer R1 can be formed by exposing a photoresist layer, such as a positive photoresist layer or a negative photoresist layer, on the substrate 210 with a patterned mask. The patterned mask is applied to the photoresist layer, and some regions are covered by the patterned mask to block light so that the uncovered regions of the photoresist layer will be exposed to light. A solvent is then applied to the photoresist layer in order to remove the covered regions or the uncovered regions of the photoresist layer. In the case of the positive photoresist layer, the uncovered region of the photoresist layer is degraded and dissolved away, such that the patterned photoresist layer R1 is formed. In the case of the negative photoresist layer, the uncovered region of the photoresist layer is strengthened by the light, and the solvent dissolves the covered region of the photoresist layer away, such that the patterned photoresist layer R1 is formed.

Reference is made to FIG. 4. In FIG. 4, two trenches T are formed in the p-type well P1 and the first n-type well N1, such that the source region 220a and two drain regions 230 are formed. The two trenches T are formed between the two drain regions 230, and the source region 220a is formed between the two trenches T. The trenches T can be formed by an anisotropic etching process, such as a dry etching process, and the dry etching process can include a reactive ion etching process or a plasma etching process. The present disclosure is not limited in this respect. The source region 220a includes an n-type portion 221a and a p-type portion 223a under the n-type portion 221a, and each drain region 230 has an n-type portion 231 and a p-type portion 233 under the n-type portion 231, in which a vertical length V1 of the n-type portion 221a is substantially the same as a vertical length V2 of each n-type portion 231. The source region 220a has a p-n junction 225a between the n-type portion 221a and the p-type portion 223a, and each drain region 230 has a p-n junction 235 between the n-type portion 231 and the p-type portion 233. Moreover, the p-n junction 225a is level with each p-n junction 235, but the present disclosure is not limited in this respect.

Figure 5:
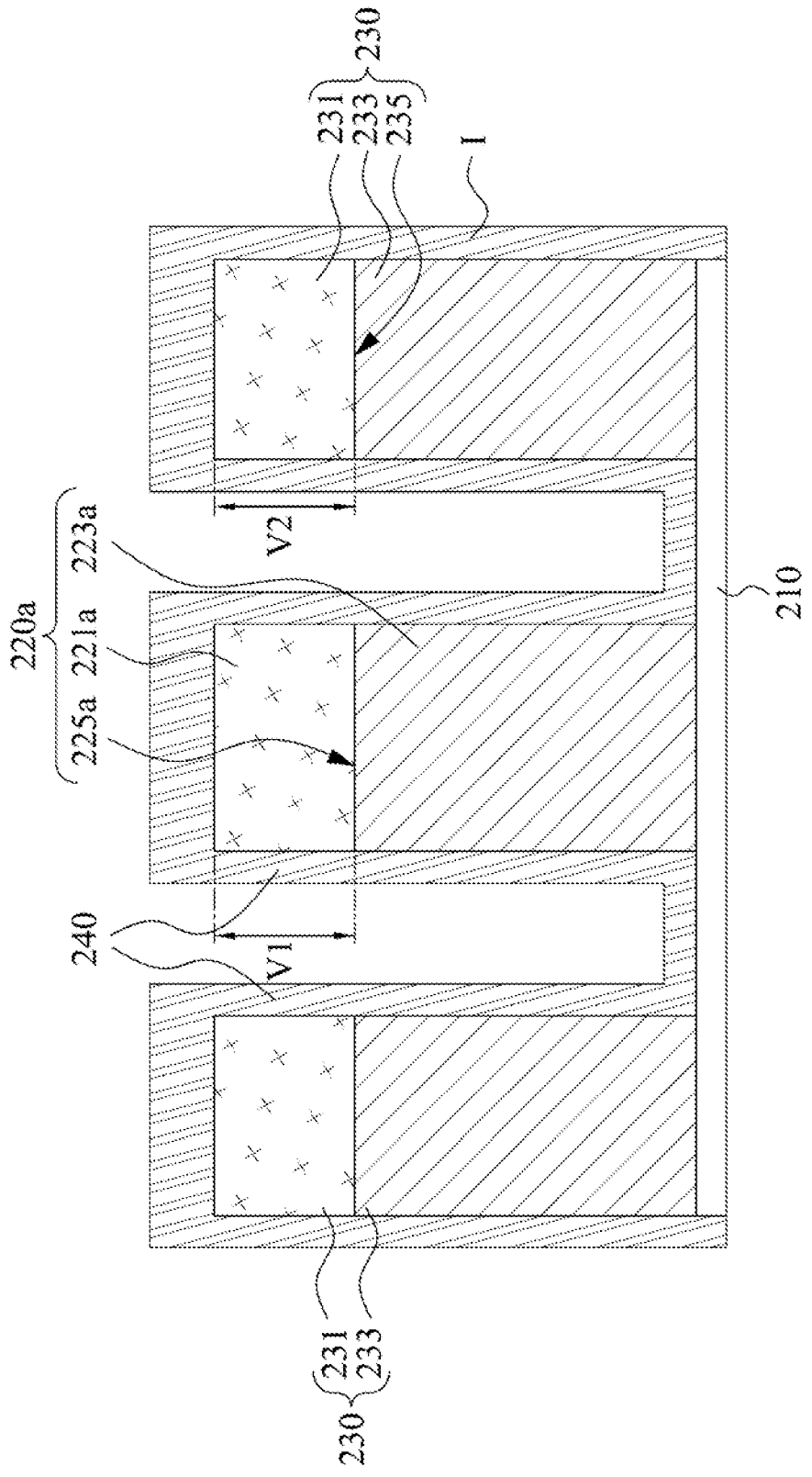

Reference is made to FIG. 5. FIG. 5 can represent Step 130, in which the dielectric layer 240 is conformally formed over the substrate 210 and the trenches T. The dielectric layer 240 can be formed by a deposition process such as chemical vapor deposition (CVD), plasma enhanced chemical vapor deposition CVD (PECVD), physical vapor deposition (PVD), atomic layer deposition (ALD), or another suitable deposition technique. In some embodiments of the present disclosure, the dielectric layer 240 can include dielectric material which has a high dielectric constant. For example, the dielectric layer 240 can include $SiO_2$, silicon oxynitride (SiON), metal oxide such as hafnium oxide (HfO), or another suitable gate-oxide material, but the disclosure is not limited thereto. In some embodiments of the present disclosure, the dielectric layer 240 and the isolating structure I are made of the same material such as silicon oxide ($SiO_2$), and the dielectric layer 240 is integrally formed on the isolating structure I.

Figure 6:
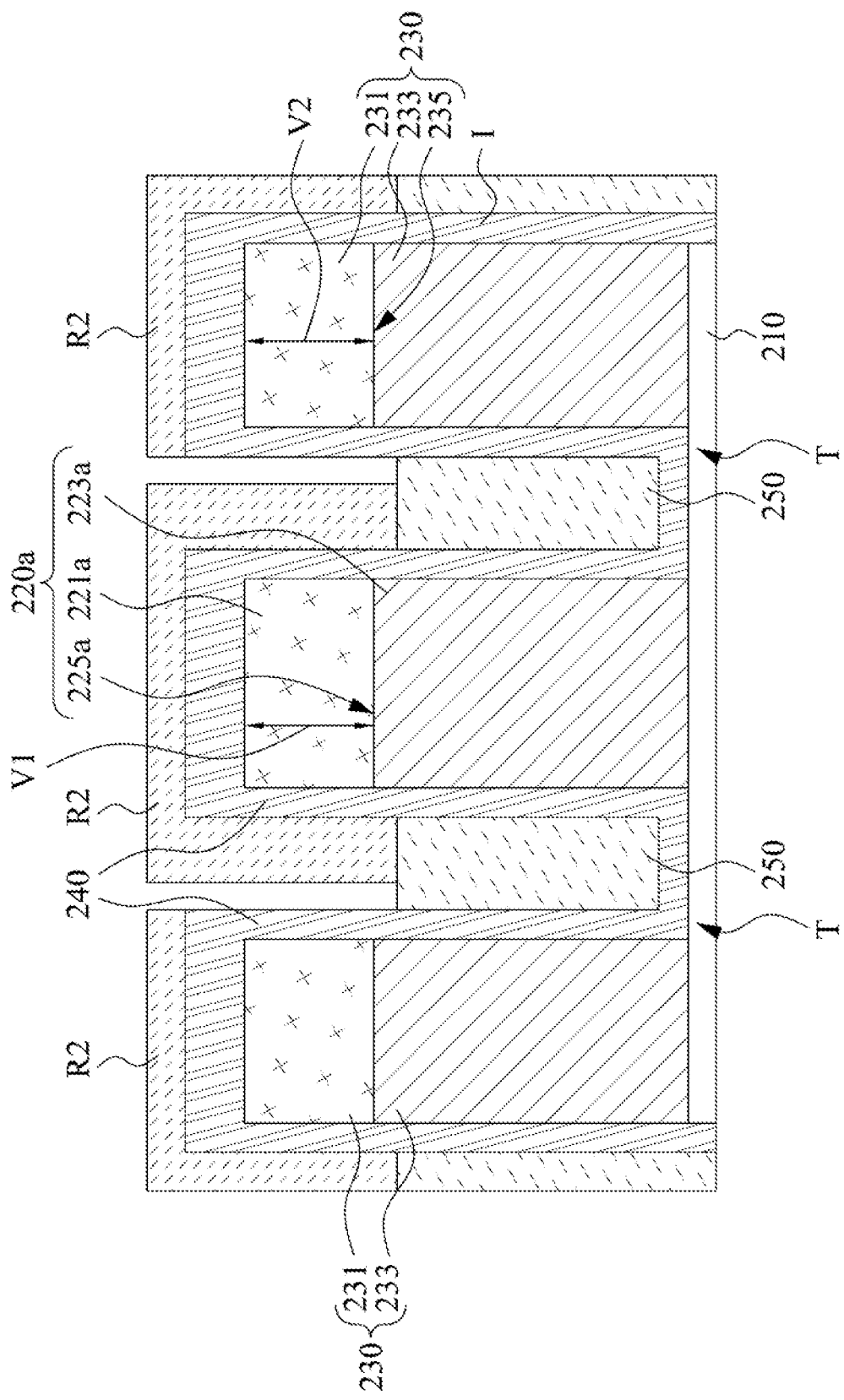

Reference is made to FIG. 6. FIG. 6 can represent Step 150, in which two metal structures 250 are respectively formed in the two trenches T, and the dielectric layer 240 surrounds the metal structures 250. The metal structures 250 are filled in the trenches T, and the metal structures 250 can include titanium nitride (TiN), tantalum nitride (TaN), or any suitable gate material. The present disclosure is not limited in this respect. After the metal structures 250 are formed, a patterned photoresist layer R2 is formed on the dielectric layer 240 and the metal structures 250, and the patterned photoresist layer R2 partially exposes a top surface of each metal structure 250.

Figure 7:
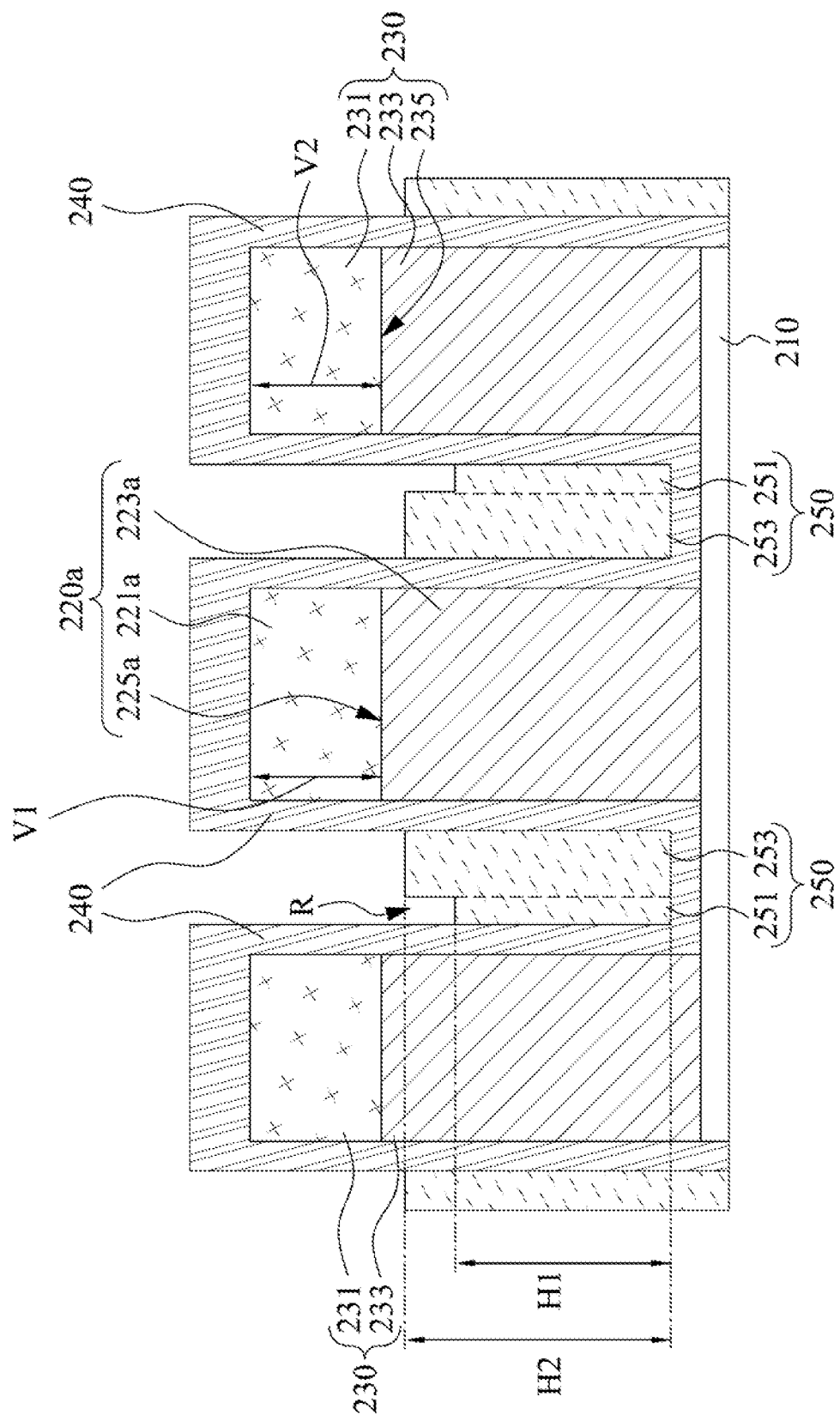

Reference is made to FIG. 7. FIG. 7 can represent Step 170, in which a first etching process is performed to an edge of the top surface of each metal structure 250, such that each metal structure 250 has a first metal portion 251 and a second metal portion 253. Each second metal portion 253 has a height H2 greater than a height H1 of the corresponding first metal portion 251, and each first metal portion 251 is between the drain region 230 and the corresponding second metal portion 253 of the same metal structure 250. For each metal structure 250, a difference between the height H1 of the first metal portion 251 and the height H2 of the second metal portion 253 is smaller than 0.1 um, and a width of the first metal portion 251 is smaller than 0.025 um. Therefore, each first metal portion 251 has a top surface lower than a top surface of the corresponding second metal portion 253, such that each metal structure 250 and the dielectric layer 240 collectively form a recess R on the first metal portion 251. The recess R has a depth smaller than 0.1 um, and a width in a direction perpendicular to the depth that is smaller than 0.025 um. Moreover, the top surface of each first metal portion 251 and the top surface of each second metal portion 253 are rectangular, and the top surfaces of the first and second metal portions 251, 253 are lower than the p-n junctions 225a, 235. The present disclosure is not limited in this respect. In some embodiments of the present disclosure, the source region 220a is between the two metal structures 250, and the two metal structures 250 are between the two drain regions 230. Therefore, the source region 220a is also located between the two drain regions 230. Each metal structure 250 can be a metal gate for controlling the current flow between the source region 220a and each drain region 230, and the configuration of the first and second metal portions 251, 253 can curb the gate-induced drain leakage (GIDL) thereof.

Reference is made to FIGS. 8-13. FIG. 8 to FIG. 13 can represent Step 190, in which a first poly-metal structure 281 and two second poly-metal structure 283 are formed. The first poly-metal structure 281 is electrically connected to the source region 220b, and each second poly-metal structure 283 is electrically connected to one of the drain regions 230.

Figure 8:
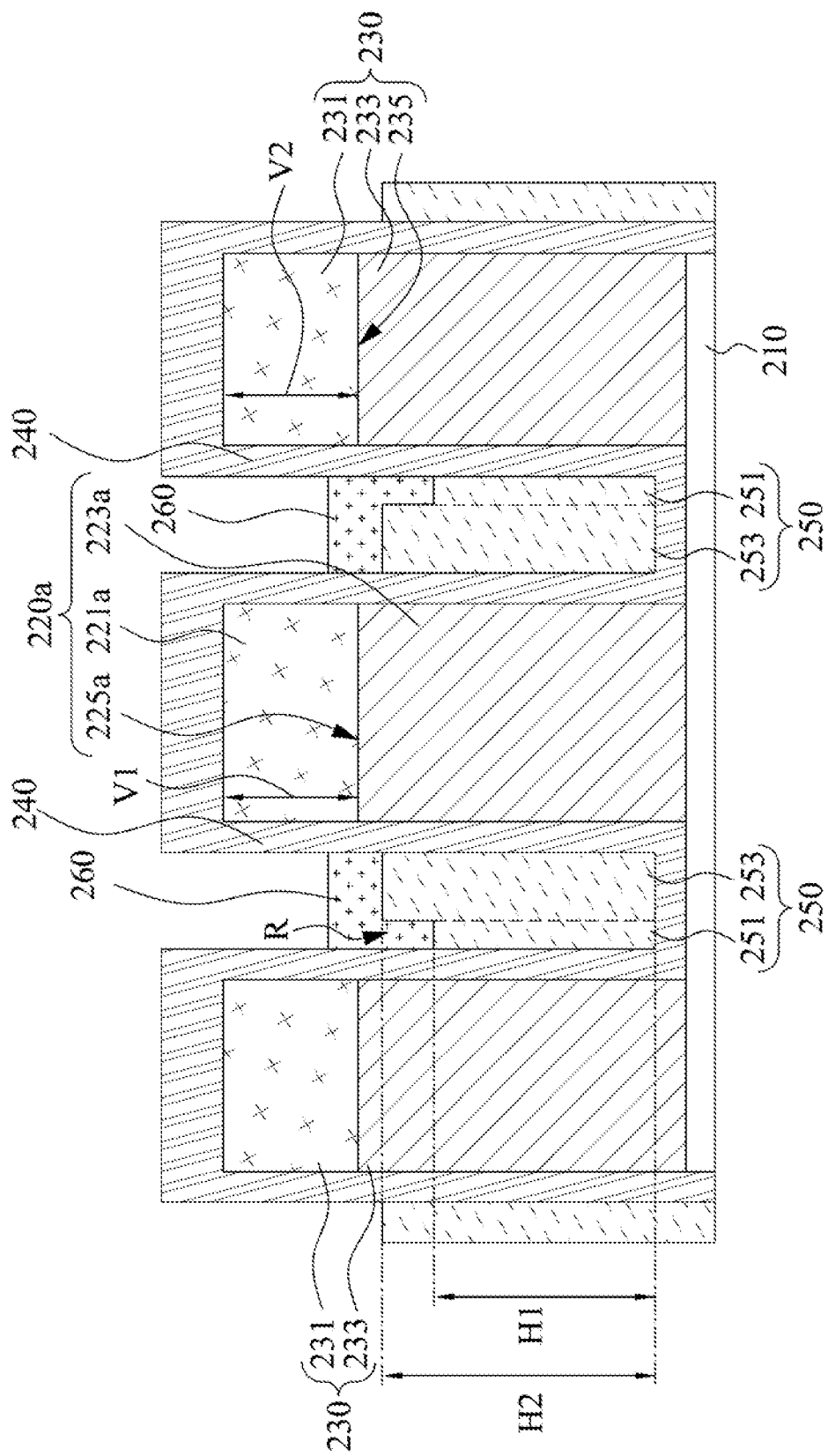

In FIG. 8, a dielectric cap 260 is formed on each metal structure 250, and the dielectric cap 260 has an extension portion that fills and extends in the recess R which is on the first metal portion 251. The dielectric cap 260 includes $SiO_2$, SiON, HfO, or any suitable dielectric material. The present disclosure is not limited in this respect.

Figure 9:
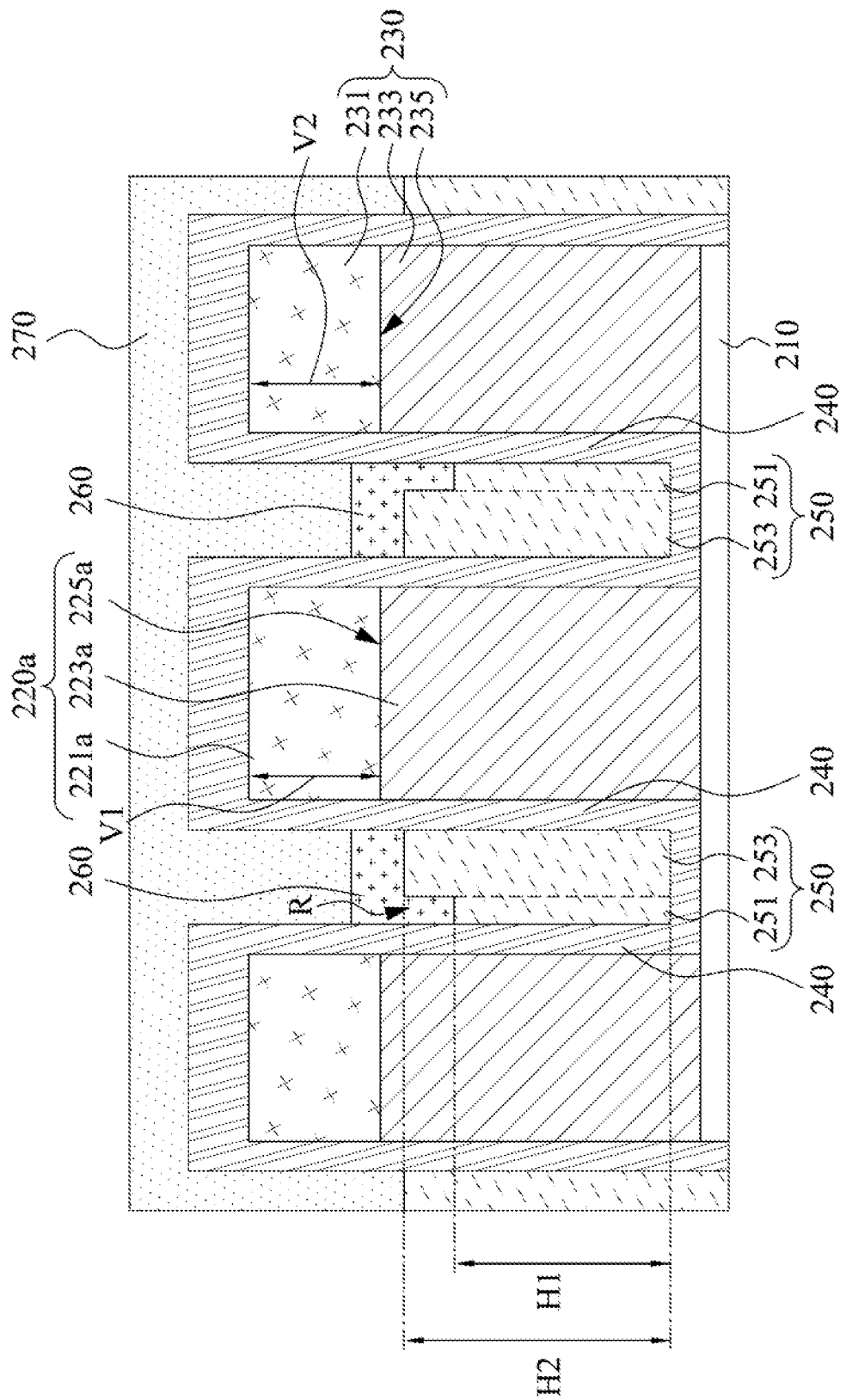

In FIG. 9, an isolation layer 270 is formed over the dielectric layer 240, the metal structure 250, and the dielectric caps 260 after the first etching process is performed. Each dielectric cap 260 has a dielectric constant lower than a dielectric constant of the isolation layer 270, in which the isolation layer 270 includes silicon nitride. That is, the dielectric constant of each dielectric cap 260 is smaller than the dielectric constant of silicon nitride. The present disclosure is not limited in this respect.

Figure 10:
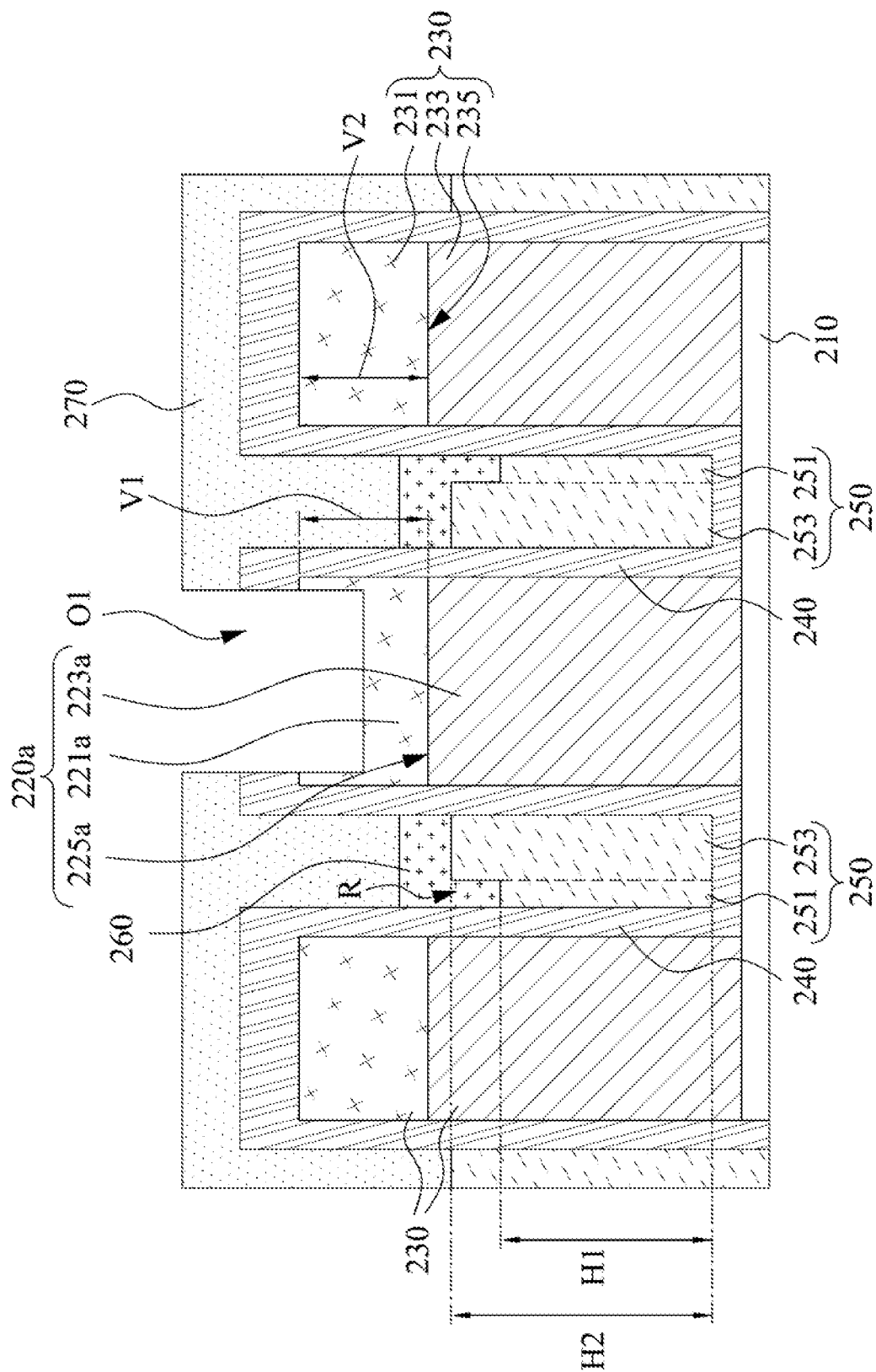

Reference is made to FIGS. 10-13. FIG. 10 to FIG. 13 can represent Step 190, in which a first poly-metal structure 281 and two second poly-metal structures 283 are formed, such that a semiconductor device 200 is obtained. In FIG. 10, a first opening O1 is formed to expose the source region 220a, and the first opening O1 extends through the isolation layer 270 and partially in the source region 220a. Specifically, the first opening O1 is partially in the n-type portion 221a. The first opening O1 can be formed by any suitable anisotropic etching process such as a reactive ion etching process or a plasma etching process. The present disclosure is not limited in this respect.

Figure 11:
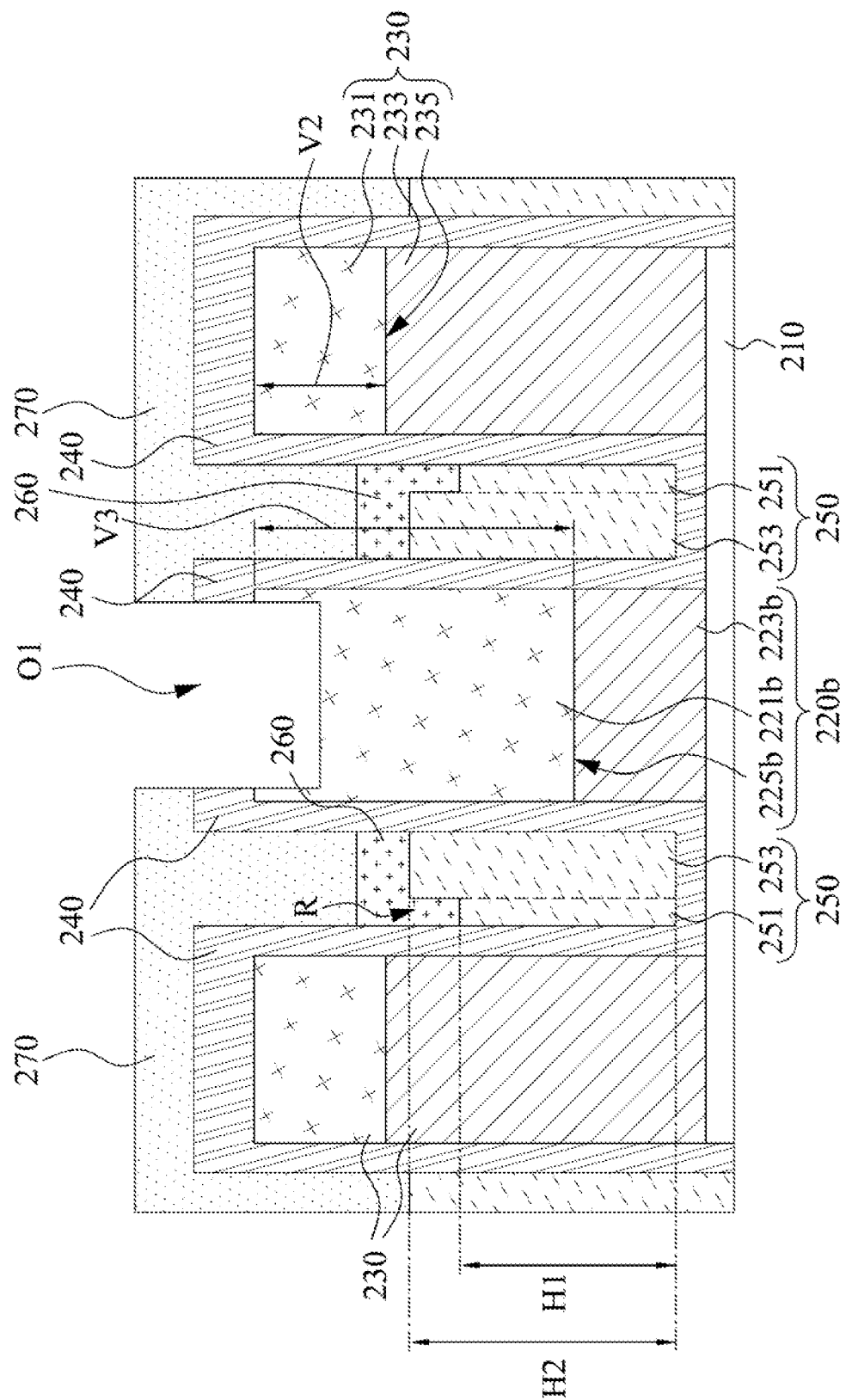

In FIG. 11, the source region 220a is doped with an n-type dopant to form a source region 220b, such that the source region 220b has an n-type portion 221b which has a vertical length V3 greater than a vertical length V2 of the n-type portion 231 of each drain region 230. Moreover, the source region 220b has a p-n junction 225b between the n-type portion 221b and the p-type portion 223b, and the p-n junction 225b is lower than the p-n junction 235 of each drain region 230. The p-n junction 225b is lower than the top surfaces of the first and second metal portions 251, 253, but the present disclosure is not limited in this respect.

Figure 12:
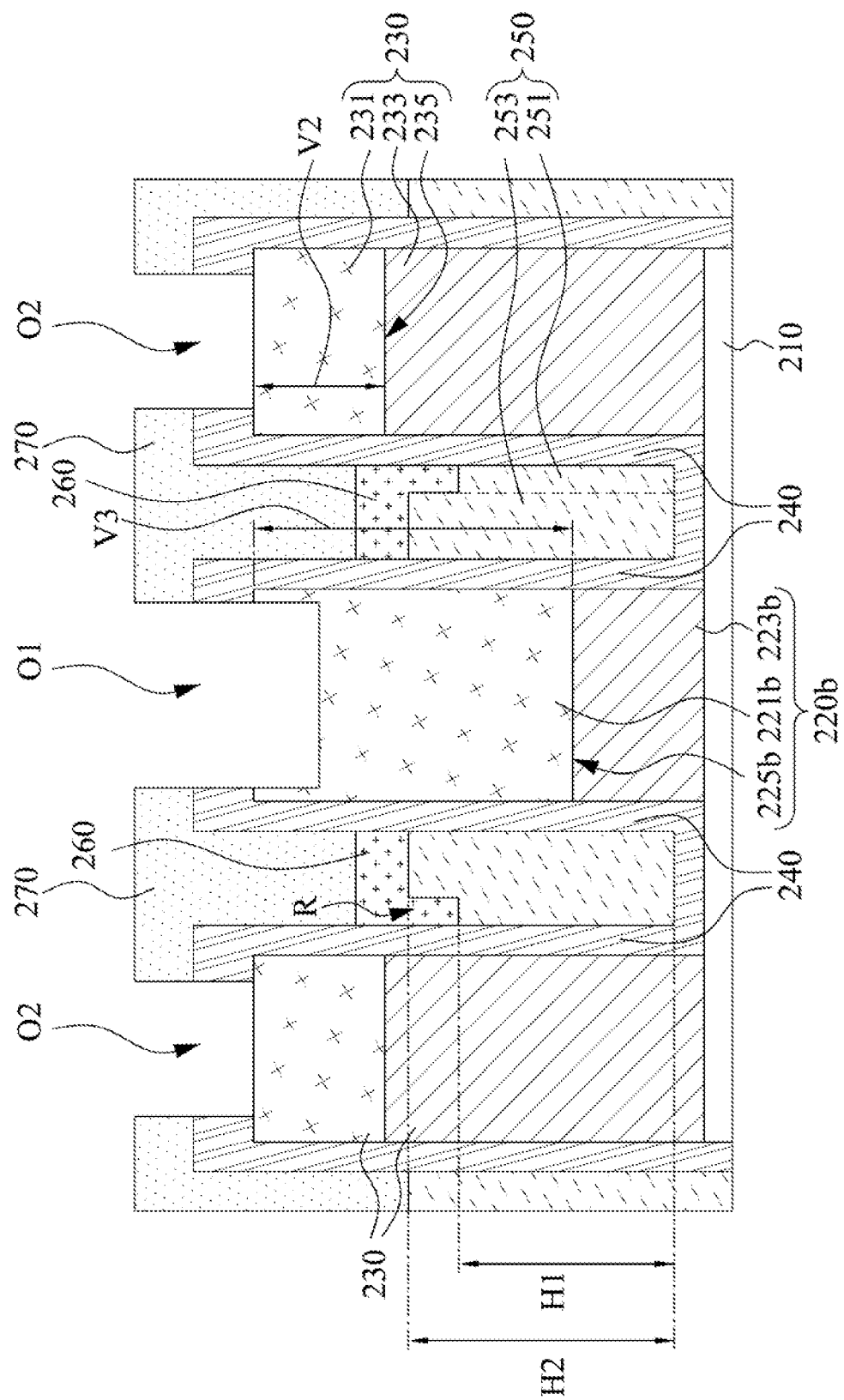
Figure 13:
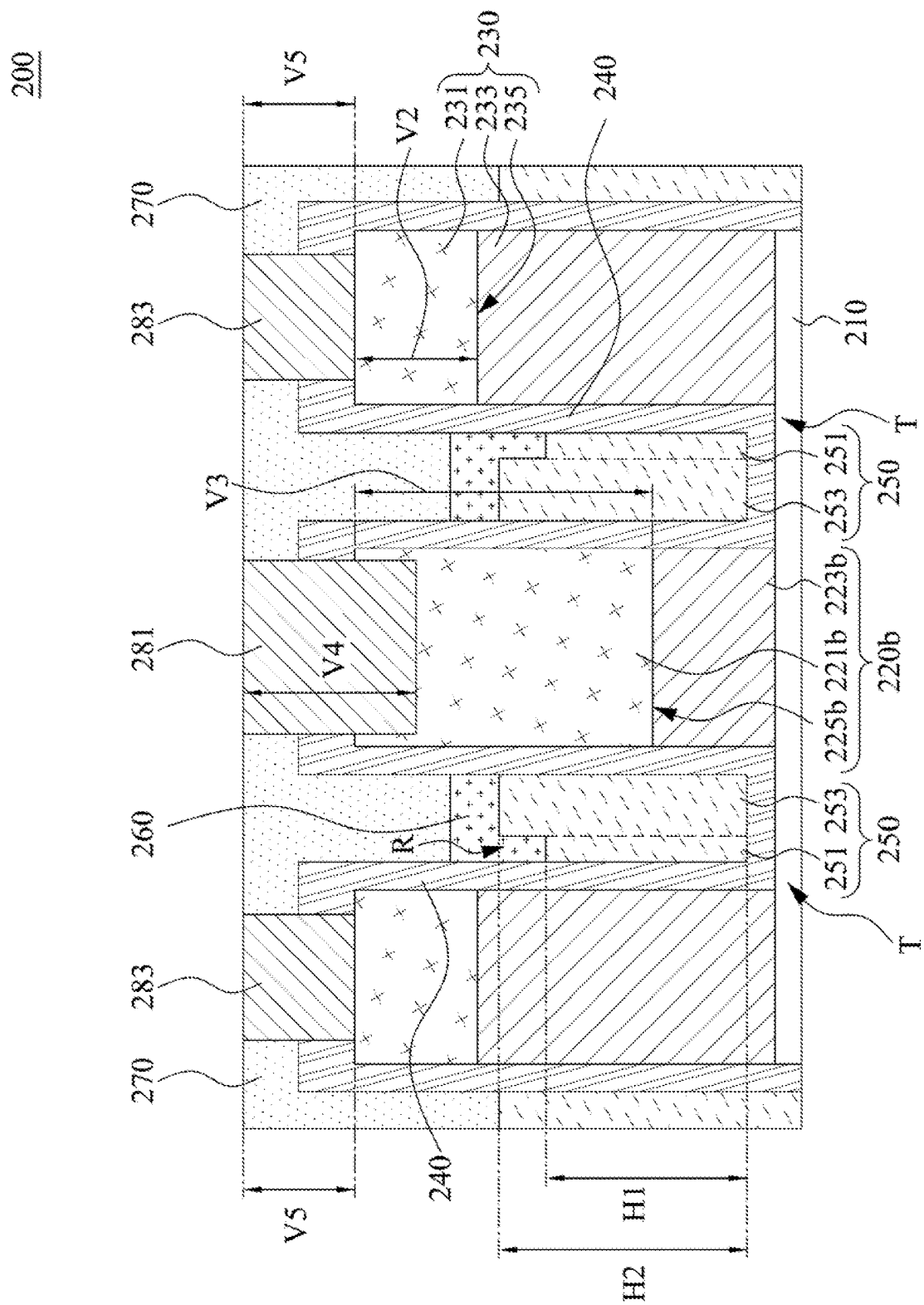

In FIG. 12, two second openings O2 which extend through the isolation layer 270 respectively expose the two drain regions 230. The two second openings O2 can be formed by any suitable anisotropic etching process such as a reactive ion etching process or a plasma etching process, and the present disclosure is not limited in this respect. In FIG. 13, the first and second poly-metal structures 281, 283 are formed by any suitable deposition process, such as CVD or PECVD. The first poly-metal structure 281 is formed in and fills the first opening O1, and two second poly-metal structures 283 are formed in and fill the two second openings O2, respectively. The first poly-metal structure 281 is electrically connected to the source region 220b, and the second poly-metal structures 283 are electrically connected to the drain regions 230, respectively. Moreover, each second poly-metal structure 283 is electrically connected to a capacitor (not shown), such that current flow can be selectively transferred into the capacitor from the two drain regions 230. The first poly-metal structure 281 has a vertical length V4 greater than a vertical length V5 of each second poly-metal structure 283, and a bottom surface of the first poly-metal structure 281 is lower a bottom surface of each second poly-metal structure 283. The present disclosure is not limited in this respect.

Reference is made to FIG. 13. Another aspect of the present disclosure is related to a semiconductor device 200, which includes a substrate 210, a source region 220b, two drain regions 230, a dielectric layer 240, and two metal structures 250. The substrate 210 includes two trenches T therein, and the dielectric layer 240 is conformally formed over the substrate 210 and the two trenches T. The source region 220b and the two drain regions 230 are in the substrate 210. The two metal structures 250 are respectively in the two trenches T and surrounded by the dielectric layer 240. In addition, the source region 220b is between the two metal structures 250, and the two metal structures 250 are between the two drain regions 230. The present disclosure is not limited in this respect.

In some embodiments of the present disclosure, the source region 220b has an n-type portion 221b and a p-type portion 223b under the n-type portion 221b, and each drain region 230 has an n-type portion 231 and a p-type portion 233 under the n-type portion 231, in which the n-type portion 221b has a vertical length V3 greater than a vertical length V2 of the n-type portion 231. Therefore, a p-n junction 225b between the n-type portion 221b and the p-type portion 223b is lower than a p-n junction 235 between the n-type portion 231 and the p-type portion 233. The present disclosure is not limited in this respect.

Each metal structure 250 has a first metal portion 251 and a second metal portion 253, and the second metal portion 253 has a height H2 greater than a height H1 of the corresponding first metal portion 251. For each metal structure 250, a difference between the height H1 of the first metal portion 251 and the height H2 of the second metal portion 253 is smaller than 0.1 um, and the first metal portion 253 has a width smaller than 0.025 um. In other words, each first metal portion 251 has a top surface lower than a top surface of the corresponding second metal portion 253, such that each first metal portion 251, the corresponding second metal portions 253, and the dielectric layer 240 collectively form a recess R on the first metal portion 251. The recess R has a depth smaller than 0.1 um, and a width in a direction perpendicular to the depth that is smaller than 0.025 um. Moreover, the top surface of each first metal portion 251 and the top surface of each second metal portion 253 are rectangular, and thus, the metal structure 250 can be stair-shaped. The present disclosure is not limited in this respect.

In some embodiments of the present disclosure, the semiconductor device 200 further includes an isolation layer 270 over the dielectric layer 240 and the metal structures 250, in which the first and second poly-metal structures 281, 283 extend through the isolation layer 270. The isolation layer 270 can be formed by any suitable deposition process, such as CVD or LPCVD, and the isolation layer 270 can include silicon nitride. The present disclosure is not limited in this respect.

In some embodiments of the present disclosure, the semiconductor device 200 further includes two dielectric caps 260, and each dielectric cap 260 is located between the isolation layer 270 and each metal structure 250. The two dielectric caps 260 are respectively located on and in contact with the two metal structures 250, and the isolation layer 270 is formed on the two dielectric caps 260. Each dielectric cap 260 has a dielectric constant lower than a dielectric constant of the isolation layer 270. That is, the dielectric constant of each dielectric cap 260 is lower than the dielectric constant of silicon nitride. The present disclosure is not limited in this respect.

In some embodiments of the present disclosure, the semiconductor device 200 further includes a first poly-metal structure 281 and two second poly-metal structures 283. The first poly-metal structure 281 is partially in the source region 220b, and the two second poly-metal structures 283 are in contact with and located on the two drain regions 230, respectively. The first poly-metal structure 281 has a vertical length V4 greater than a vertical length V5 of each second poly-metal structure 283, and the first poly-metal structure 281 has a bottom surface lower than a bottom surface of each second poly-metal structure 283. As a result, the gate-induced drain leakage can be efficiently curbed.

In embodiments of the present disclosure, a metal structure is between a source region and a drain region, in which each metal structure has a first metal portion and a second metal portion which have different heights. As a result, the metal structure configured to be a gate metal structure can control the current flow between the source region and the drain region, so as to curb the gate-induced drain leakage thereof.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor device, comprising:
   forming a first source region and a drain region in an active region of a substrate, wherein a trench is between the first source region and the drain region;
   conformally forming a dielectric layer over the substrate and the trench;
   forming a metal structure in the trench, wherein the dielectric layer surrounds the metal structure;
   performing a first etching process to an edge of the metal structure, such that the metal structure has a first metal portion and a second metal portion which has a height greater than a height of the first metal portion, wherein the first metal portion is between the drain region and the second metal portion and the first and second metal portions are a continuous piece of a same material and both in direct contact with the dielectric layer; and
   forming a first poly-metal structure electrically connected to the first source region and a second poly-metal structure electrically connected to the drain region.

2. The method of claim 1, wherein forming the first source region and the drain region comprises:
   forming a p-type well in the substrate and a first n-type well in the p-type well; and
   forming the trench in the p-type well and the first n-type well, such that the first source region and the drain region are formed.

3. The method of claim 1, wherein forming the first poly-metal structure comprises:
   forming an isolation layer over the dielectric layer and the metal structure after the first etching process;
   forming a first opening extending through the isolation layer to expose the first source region; and
   forming the first poly-metal structure in the first opening.

4. The method of claim 3, further comprising:
   doping the first source region with an n-type dopant to form a second source region before the first poly-metal structure is formed, such that the second source region has a p-n junction lower than a p-n junction of the drain region.

5. The method of claim 3, further comprising forming a dielectric cap on the metal structure before the isolation layer is formed, wherein the dielectric cap has a dielectric constant lower than a dielectric constant of the isolation layer.

6. The method of claim 1, wherein forming the second poly-metal structure comprises:
   forming an isolation layer over the dielectric layer and the metal structure after the first etching process is performed;
   forming a second opening extending through the isolation layer to expose the drain region; and
   forming the second poly-metal structure in the second opening.

7. The method of claim 1, wherein the second metal portion is closest to the first source region with respect to any other portion of the metal structure.

8. The method of claim 1, wherein the first poly-metal structure has a vertical length greater than a vertical length of the second poly-metal structure.

9. The method of claim 1, a difference between the height of the first metal portion and the height of the second metal portion is smaller than 0.1 um.

10. The method of claim 4, wherein the p-n junction of the second source region is lower than top surfaces of the first and second metal portions and the p-n junction of the drain region is higher than the top surfaces of the first and second metal portions.

* * * * *